United States Patent [19]
Pascucci

[11] Patent Number: 5,968,183
[45] Date of Patent: Oct. 19, 1999

[54] SEMICONDUCTOR MEMORY DEVICE WITH CLOCKED COLUMN REDUNDANCY AND TIME-SHARED REDUNDANCY DATA TRANSFER APPROACH

[75] Inventor: Luigi Pascucci, Sesto San Giovanni, Italy

[73] Assignee: SGS-Thomson Microelectronics S.r.l., Agrate Brianza, Italy

[21] Appl. No.: 08/868,214

[22] Filed: Jun. 3, 1997

[30] Foreign Application Priority Data

Jun. 6, 1996 [EP] European Pat. Off. .............. 96830324

[51] Int. Cl.⁶ ...................................................... G06F 11/00
[52] U.S. Cl. ................................................ 714/6; 365/201
[58] Field of Search ........................ 395/182.04, 182.03, 395/182.06, 182.09, 183.01, 183.06, 183.11; 371/21.1, 10.2, 10.3, 22.35, 22.5; 365/201, 200

[56] References Cited

U.S. PATENT DOCUMENTS

| | | | |
|---|---|---|---|
| 4,495,603 | 1/1985 | Varshney ................................. | 365/233 |
| 4,628,480 | 12/1986 | Floyd ..................................... | 364/900 |
| 5,535,161 | 7/1996 | Kato ....................................... | 365/200 |
| 5,555,522 | 9/1996 | Anami et al. ............................ | 365/200 |
| 5,602,786 | 2/1997 | Pascucci et al. ........................ | 365/200 |
| 5,610,865 | 3/1997 | Shin et al. ............................... | 365/200 |
| 5,787,043 | 7/1998 | Akioka et al. ........................... | 365/200 |

FOREIGN PATENT DOCUMENTS

A-0 668 562  8/1995  European Pat. Off. ........ G06F 11/20

OTHER PUBLICATIONS

Sharma et al., Yield optimization of redundant multimegabit RAM's using the center–Satellite model, Wafer scale integration, IEEE International test conference, pp. 200–209, Mar. 1992.

Horiguchi, M, Redundancy techniques for high density DRAMs, IEEE International test conference, pp. 22–29, May 1997.

European Search Report from European Patent Application 96830324.8, filed Jun. 6, 1996.

Primary Examiner—Robert W. Beausoliel, Jr.
Assistant Examiner—Nadeem Iqbal
Attorney, Agent, or Firm—Wolf, Greenfield & Sacks, P.C.

[57] ABSTRACT

A semiconductor memory device includes: a plurality of output data terminals; a matrix of memory cells including a plurality of groups of columns of memory cells, each group of columns being associated with a respective output data terminal; column selection means associated with the matrix of memory cells for selectively coupling one column for each of the group of columns to a respective sensing means driving the output data terminal; redundancy columns of redundancy memory cells for functionally replacing defective columns in the matrix; redundancy column selection means associated with the redundancy columns for selectively coupling one redundancy column to a redundancy sensing means; defective address storage means for storing defective addresses of the defective columns and identifying codes suitable for identifying the groups of columns wherein the defective columns are located, for comparing the defective addresses with a current address supplied to the memory device and for driving the redundancy column selection means for selecting a redundancy column when a current address supplied to the memory device coincides with one of the defective addresses. A shared bus including a plurality of signal lines is provided in the memory device for interconnecting a plurality of circuit blocks of the memory device and for transferring signals between the circuit blocks, the shared bus being selectively assignable to the circuit blocks in prescribed respective time intervals. The memory device also includes first bus assignment means associated with the defective address storage means and second bus assignment means associated with the sensing means.

41 Claims, 6 Drawing Sheets

SEMICONDUCTOR MEMORY DEVICE WITH CLOCKED COLUMN REDUNDANCY AND TIME-SHARED REDUNDANCY DATA TRANSFER APPROACH

BACKGROUND OF THE INVENTION

1. Field of the Invention

The present invention relates to a semiconductor memory device with clocked column redundancy and time-shared redundancy data transfer approach, particularly to an electrically-programmable non-volatile semiconductor memory device such as an EPROM, an EEPROM or a Flash EEPROM.

2. Discussion of the Related Art

It is known that semiconductor memory devices comprise a matrix of memory cells arranged in rows (word lines) and columns (bit lines).

It is also known to provide semiconductor memory devices with a so-called column redundancy circuit comprising redundancy bit lines of redundancy memory cells, useful for functionally replacing defective bit lines in the memory matrix detected during the in-factory, post-manufacturing testing of the memory devices.

The column redundancy circuit comprises redundancy memory registers for storing addresses of the defective bit lines (defective addresses) and for comparing the stored defective addresses with a current address supplied to the memory device, so that when coincidence between the current address and a defective address is detected, selection of the defective bit line is prevented and a redundancy bit line is instead selected.

The provision of a column redundancy circuit in a memory device can occupy a significant area in the memory device chip, and generally complicates the design of the device layout, since several signal lines are necessary to route the signals through the chip. This limits the benefits, in term of manufacturing yield, of the provision of the column redundancy circuit.

In view of the state of the art described, it is an object of the present invention to provide a semiconductor memory device with a novel column redundancy architecture suitable to reduce the number of signal lines which are provided in the memory device chip.

SUMMARY OF THE INVENTION

According to the present invention, this and other objects are achieved by means of a semiconductor memory device comprising:

a plurality of output data terminals;

a matrix of memory cells comprising a plurality of groups of columns of memory cells, each group of columns being associated with a respective output data terminal;

column selection means associated with said matrix of memory cells for selectively coupling one column for each of said groups of columns to a respective sensing means driving said output data terminal;

redundancy columns of redundancy memory cells for functionally replacing defective columns in said matrix;

redundancy column selection means associated with said redundancy columns for selectively coupling one redundancy column to a redundancy sensing means;

defective address storage means for storing defective addresses of said defective columns and identifying codes suitable for identifying the groups of columns wherein the defective columns are located, for comparing said defective addresses with a current address supplied to the memory device and for driving said redundancy column selection means for selecting a redundancy column when a current address supplied to the memory device coincides with one of said defective addresses;

a shared bus including a plurality of signal lines provided in the memory device for interconnecting a plurality of circuit blocks of the memory device and for transferring signals between said circuit blocks, the shared bus being selectively assignable to said circuit blocks in prescribed respective time intervals;

first bus assignment means associated with the defective address storage means;

second bus assignment means associated with said sensing means;

the first bus assignment means assigning the shared bus, during a first prescribed time interval of a read cycle of the memory device, to said defective address storage means for transferring the identifying code of an addressed defective column to the output data terminals;

the second bus assignment means assigning the shared bus, during a second prescribed time interval of the read cycle, to said sensing means for transferring output signals of said sensing means to said output data terminals;

the transferred identifying code determining an output data terminal associated to the group of columns to which the addressed defective column belongs to be supplied by an output signal of said redundancy sensing means in alternative to an output of the sensing means associated with said group of columns.

Thanks to the provision of a general purpose shared bus which can be used, by means of a time-shared assignment scheme, to transfer redundancy control signals as well as read data signals, it is possible to reduce the number of signal lines needed to be provided in the memory device chip.

BRIEF DESCRIPTION OF THE DRAWINGS

These and other features and advantages of the present invention will be made more evident by the following detailed description of one embodiment thereof, illustrated as a non-limiting example in the annexed drawings, wherein.

DETAILED DESCRIPTION

Figure 1:
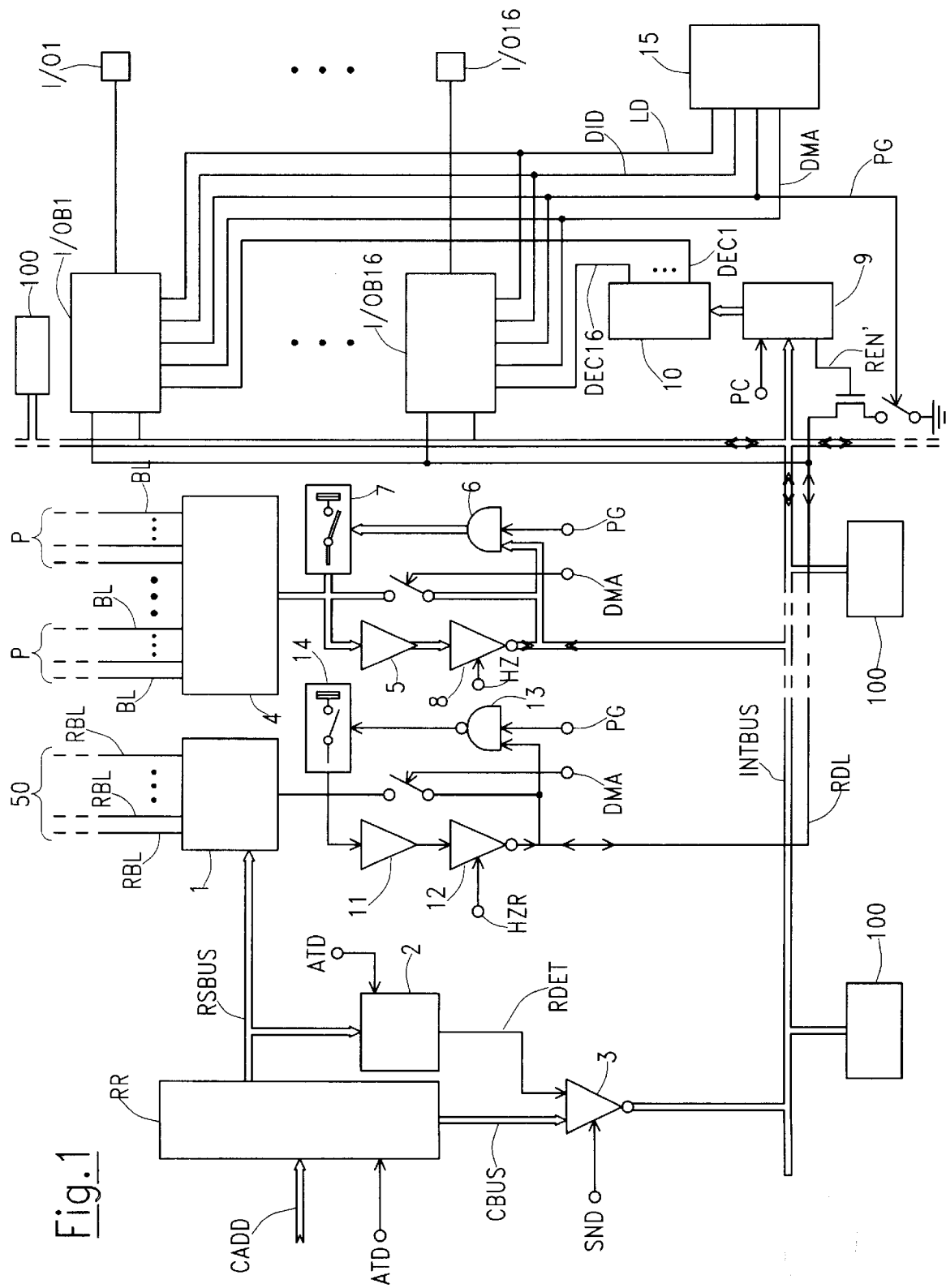
FIG. 1 is a schematic block diagram of a column redundancy circuit for a semiconductor memory device according to the present invention.

With reference to FIG. 1, the memory device conventionally comprises a matrix of memory cells (not shown) arranged in rows (word lines) and columns (bit lines) BL. The matrix of memory cells is conventionally divided in portions, each one associated with a respective bit of an output data word of the memory device: for example, supposing that the memory device has a sixteen-bit output data word (sixteen data input/output terminals I/O1–I/O16), the memory matrix comprises sixteen matrix portions. Each of said portions of the memory matrix is made up of a respective packet P of bit lines BL of memory cells. A column multiplexer 4, known per-se, allows selection of one bit line BL inside each packet P and to electrically connect the selected bit line to a respective sensing circuit of a group 5 of sixteen sensing circuits. Each one of said sensing circuits can be made to supply, in a way which will be described later, a respective output data buffer I/OB1–I/OB16 driving a respective output data terminal I/O1–I/O16 of the memory device. In electrically-programmable memory devices, each packet P of bit lines BL is also associated with a respective programming circuit (schematically represented in FIG. 1 by the reference numerals 6 and 7) which is supplied by a respective input data buffer connected to the respective data terminal I/O1–I/O16 (in FIG. 1 the input data buffers are intended to be incorporated in the respective output data buffers I/OB1–I/OB16). When the memory device is operated in read mode, for every configuration of address signals supplied to the memory device one bit line BL in each packet P is selected and electrically connected by means of the multiplexer 4 to the respective sensing circuit. The same occurs in program mode, wherein the multiplexer 4 allows to select one bit line BL inside each packet P and to electrically connect the selected bit line BL to the respective programming circuit.

Referring to FIG. 1, a column redundancy circuit according to the present invention for a semiconductor memory device is schematically shown. The column redundancy circuit is integrated in the semiconductor memory device to allow the functional substitution of redundancy bit lines of redundancy memory cells for defective bit lines of memory cells of the memory matrix.

The column redundancy circuit comprises a plurality RR of programmable non-volatile memory registers (redundancy registers) for storing addresses of defective matrix bit lines (defective addresses).

The redundancy registers RR are supplied with a bus CADD of column address signals which allow selection of one bit line BL in each packet P of bit lines of the memory matrix, and with a first internal timing signal ATD, generated internally to the memory device, the function and the timing thereof being explained in detail later on.

The redundancy registers RR generate redundancy bit line selection signals which in FIG. 1 are shown grouped in a bus RSBUS. The redundancy selection signals of bus RSBUS control a redundancy bit line multiplexer 1 which allows selection of one redundancy bit line RBL out of a packet 50 of redundancy bit lines. The signals of bus RSBUS also supply a redundancy detector 2 which is further supplied by the internal timing signal ATD. The redundancy detector 2 generates an output signal RDET which is activated when one of the redundancy selection signals of bus RSBUS is activated, according to a timing determined by signal ATD.

In the column redundancy circuit according to the present invention, a single packet 50 of redundancy bit lines RBL is provided for replacing defective bit lines in all the packets P of matrix bit lines BL forming the portions of the memory matrix associated with the bits of the output data word of the memory device. When a defective bit line is detected in one of said packets P of bit lines, the defective bit line is functionally replaced by a redundancy bit line RBL of the packet 50 of redundancy bit lines; all the bit lines belonging to the other packets P of matrix bit lines BL but having the same address of the defective bit line are not replaced by redundancy bit lines, as instead occurs in other types of known column redundancy architectures.

In order to accomplish the above-mentioned operation, the redundancy registers RR shall store not only the addresses of the defective bit lines, but also informations suitable for identifying the packet P of matrix bit lines BL to which the defective bit line belongs. Such information is advantageously stored in the form of a digital code suitable for identifying one packet of bit lines among all the bit line packets in which the memory matrix is divided. When a defective bit line is addressed, the respective identifying digital code is supplied to a bus of signal lines CBUS.

The identifying code and signal RDET must be transferred from the region of the chip wherein the redundancy memory registers are integrated to other regions of the chip, which can be significantly far away.

To this purpose, in the redundancy circuit according to the present invention the signal lines of bus CBUS and signal line RDET generated by the redundancy detector 2 are supplied to respective tri-state interface circuits 3 (one tri-state interface circuit for each one of the signal lines of bus CBUS and for signal line RDET), controlled by a second timing signal SND also generated internally to the memory device and synchronous with the first timing signal ATD. Each one of the tri-state circuits 3 drives a respective signal line of a general-purpose shared bus INTBUS of signal lines provided in the memory device for carrying signals through the memory device chip. Bus INTBUS can be assigned to other circuit blocks 100 of the memory device which are located in several different regions of the memory device chip. Bus INTBUS is also used to connect output lines of the sensing circuits 5 associated with the packets P of matrix bit lines to the respective input/output data buffers I/OB1–I/OB16. To this purpose, the output of each one of the sixteen sensing circuits 5 is coupled to a respective signal line of bus INTBUS by means of a respective tri-state interface circuit of a group 8 of sixteen interface circuits. Bus INTBUS is also used to connect the programming circuits 6 and 7 associated with the sixteen packets P of matrix bit lines BL to the respective input data buffers: the same signal line of bus INTBUS which can be assigned to a prescribed one of the sixteen sensing circuits 5 which is associated with a given packet P of bit lines BL is also used to supply the datum to be programmed to the programming circuit associated with said prescribed packet P.

A dynamic memory register 9 is formed in a region of the memory device chip in proximity of the input/output data buffers I/OB1–I/OB16, i.e. near the input/output data terminals I/O1–I/O16. The dynamic memory register 9 is controlled by a third timing signal PC generated internally to the memory device and synchronous with signals ATD and SND, and is supplied by the sub-set of signal lines of bus INTBUS which are driven by the tri-state circuits 3 for temporarily storing the data carried by the signal lines of bus CBUS and RDET as long as bus INTBUS is assigned to the redundancy registers RR and to the redundancy detector 2.

Memory register 9 supplies the data stored therein to a decoder circuit 10 which, according to the particular configuration of the signals of bus CBUS and provided that signal RDET is activated, activates one of sixteen decoded signals DEC1–DEC16.

Each one of signals DEC1–DEC16 supplies a respective input/output data buffer I/OB1–I/OB16 which is also bidirectionally connected to a respective signal line INTBUS1–16 of bus INTBUS.

Also schematically shown in FIG. 1 is a redundancy sensing circuit 11 to which a selected one of the redundancy bit lines RBL can be electrically coupled by means of multiplexer 1. An output of the redundancy sensing circuit 11 is coupled to a redundancy input/output data line RDL by means of a tri-state interface circuit 12. Line RDL also supplies a redundancy programming circuit schematically indicated by numerals 13 and 14. The redundancy input/output data line RDL supplies all the input/output data buffers I/OB1–I/OB16. It is to be noted that the redundancy sensing circuit 11 is identical to the sensing circuits of group 5, and the redundancy programming circuit 13, 14 is also identical to the programming circuits 6, 7 associated with the packets P of matrix bit lines BL.

Also schematically shown in FIG. 1 is a control logic 15 conventionally provided in the memory device to control the operation thereof. Control logic 15 generates control signals PG, DMA, DID and LD whose function will be explained in the following. Signals PG, DMA, DID and LD are supplied to all the sixteen input/output data buffers I/OB1–I/OB16. Signal PG is also supplied to the programming circuits 6 and to the redundancy programming circuit 13 to control the activation thereof. The redundancy data signal line RDL is coupled to ground by means of an N-channel MOSFET M20, controlled by a signal REN' generated by the memory register 9, and a switch SW20 controlled by signal PG. In program mode, M20 and SW20 allow to keep line RDL grounded if the bit line to be programmed is not a defective bit line.

Figure 2:
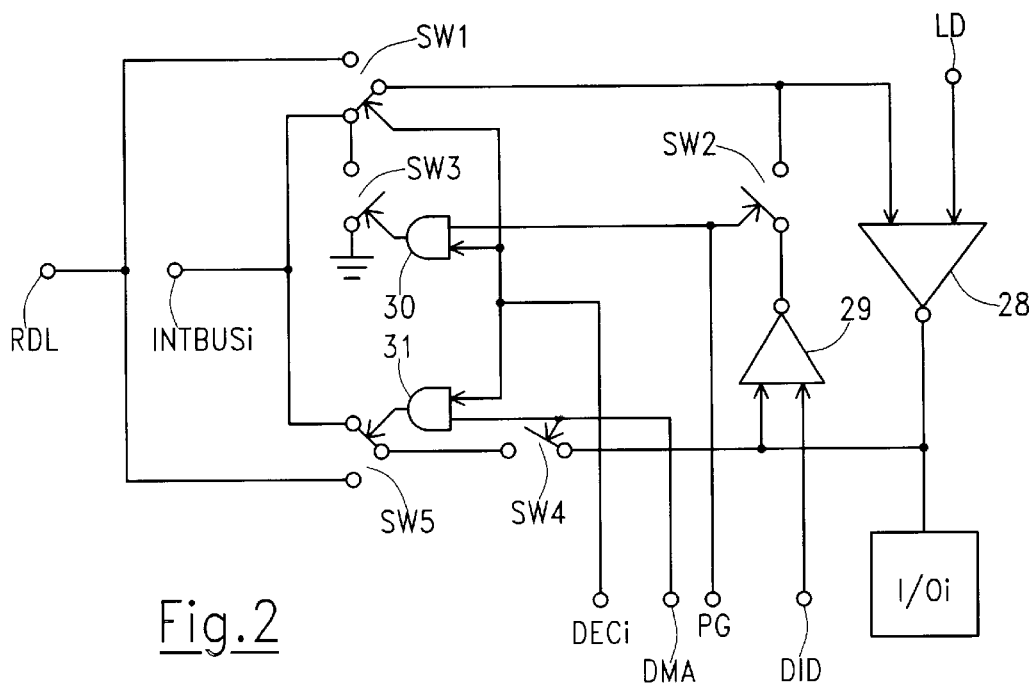
FIG. 2 is a schematic circuit diagram of one of a plurality of data input/output interface circuit of the semiconductor memory device of FIG. 1.

FIG. 2 is a circuit diagram of one of the sixteen input/output data buffers I/OB1–I/OB16. The circuit comprises an output buffer 28 having a data input which can be selectively coupled, by means of a switch SW1, to a respective signal line INTBUSi (i=1 . . . 16) of the shared bus INTBUS or to the redundancy data signal line RDL; switch SW1 is controlled by a respective signal DECi of the sixteen output signals DEC1–DEC16 of the decoder circuit 10, so that when signal DECi is deactivated switch SW1 connects the input of output buffer 28 to the respective signal line INTBUSi of bus INTBUS, while if signal DECi is activated (high logic level) switch SW1 connects the input of output buffer 28 to the redundancy data signal line RDL. The output of buffer 28 drives a respective input/output data terminal I/Oi of the memory device. Output buffer 28 is also supplied by the control signal LD which, when activated, puts the output buffer 28 in a high-impedance condition. The circuit also comprises an input buffer 29 having a data input supplied by the input/output data terminal I/Oi and an output which can be coupled, by means of a switch SW2, to the data input of the output buffer 28 so that, depending on the position of switch SW1, the output of buffer 29 can be selectively coupled either to the signal line INTBUSi or to the redundancy data line RDL. Input buffer 29 is further supplied by the control signal DID which, when activated, puts the output of input buffer 29 in a high-impedance condition. Signals PG and DECi also supply an AND gate 30 which controls a switch SW3 inserted between signal line INTBUSi and ground, so that when signals DECi and PG are both activated (high logic level) switch SW3 is closed and signal line INTBUSi is kept at the ground voltage, preventing it from remaining floating. The input/output data terminal I/Oi can also be directly coupled (for test purposes), by means of a switch SW4 and another switch SW5, either to signal line INTBUSi or to the redundancy data line RDL. Switch SW4 is controlled by the control signal DMA and is closed when signal DMA is activated; switch SW5 is controlled by an output signal of an AND gate 31 supplied by signals DECi and DMA: when signal DMA is activated, if signal DECi is deactivated the input/output data terminal I/Oi is coupled to the signal line INTBUSi, while if signal DECi is activated the input/output data terminal I/Oi is coupled to the redundancy data line RDL. →

Figure 3:
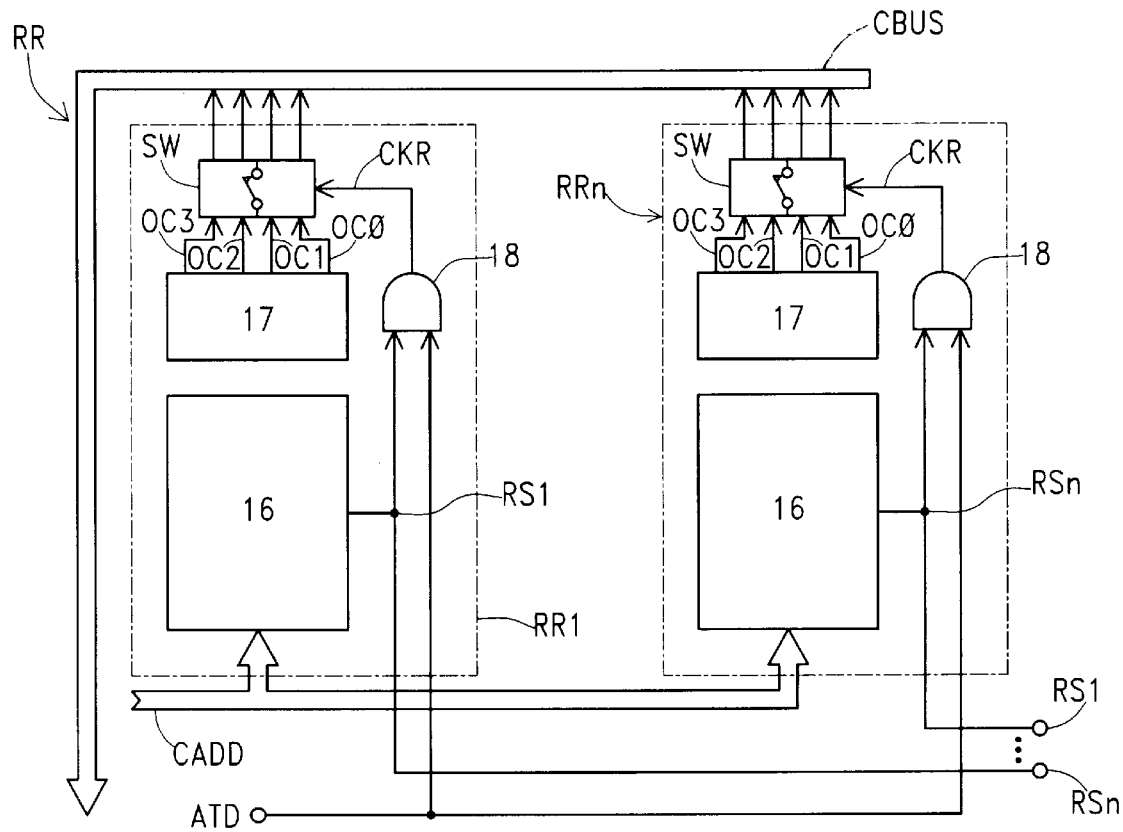
FIG. 3 is a schematic block diagram of one of a plurality of column redundancy memory registers of the column redundancy circuit of FIG. 1 for permanently storing defective bit line addresses and informations suitable for locating the defective bit lines inside a memory matrix of the memory device.

FIG. 3 is a schematic diagram showing the redundancy memory registers RR of the redundancy circuit of FIG. 1. Each redundancy memory register RR1–RRn comprises a first part 16 wherein the defective address of a defective matrix bit line BL is stored, and a second part 17 suitable to store the digital code capable of identifying one of the packets P of matrix bit lines wherein the defective bit line is located.

The first part 16 of the redundancy memory registers is supplied by the bus CADD of column address signals, and has an output signal RS1–RSn (which all together form bus RSBUS) which is activated (high logic level) when the current column address supplied to the memory device and carried by the column address signals of bus CADD coincides with the defective address stored in the first part 16 of the redundancy register.

The second part 17 of each redundancy register has four output signals OC0–OC3 which carry the four-bit digital code stored in the second part 17 of the redundancy register, identifying the packet P of bit lines BL wherein the defective bit line whose address is stored in the first part 16 of the redundancy register is located. It is to be noted that in the present example a four-bit digital code has been used because it has been assumed that the memory device has a sixteen-bit input/output data word, so that it is necessary to identify one packet P of bit lines among sixteen. For memory devices having an eight-bit input/output data word, a three-bit digital code is sufficient to identify one bit line packet P among eight.

The four signals OC0–OC3 supply an array of switches SW (four in the present example) which allow selectively connecting the four signals OC0–OC3 to respective signal lines of bus CBUS. Switches SW are controlled by an output signal CKR of an AND gate 18 having a first input supplied by the respective signal RS1–RSn, and a second input supplied by the first internal timing signal ATD. When both signal RS1–RSn and the internal timing signal ATD are logic "1"s, the output CKR of AND gate 18 is activated and switches SW close to connect signals OC0–OC3 to the respective signal lines of bus CBUS.

Figure 4:
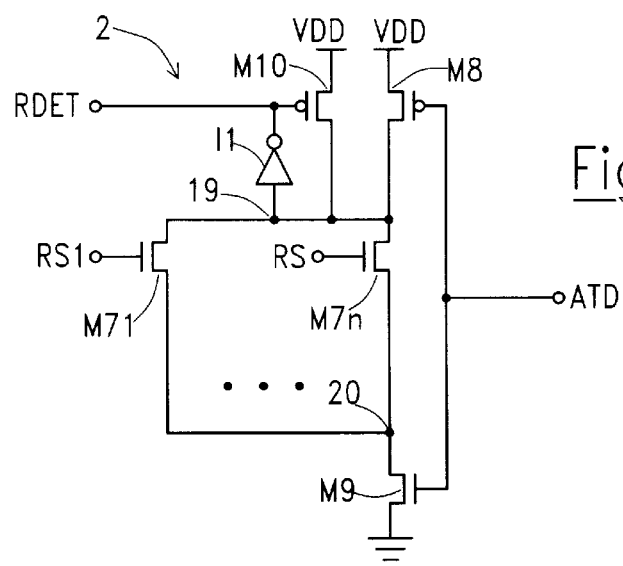
FIG. 4 is a circuit diagram of a redundancy detector of the column redundancy circuit of FIG. 1.

FIG. 4 is a diagram of the redundancy detector circuit 2. Each one of the redundancy selection signals RS1–RSn of bus RSBUS supplies a gate electrode of a respective N-channel MOSFET M71–M7n. All MOSFETs M71–M7n are connected in parallel to each other between a drain electrode 19 of a P-channel MOSFET M8 and a drain electrode 20 of an N-channel MOSFET M9; M8 has a source electrode connected to a voltage supply VDD, M9 has a source electrode connected to ground; M8 and M9 are controlled by the first internal timing signal ATD. The drain electrode 19 of M8 is supplied to an input of an inverter I1 whose output forms the signal RDET. Inverter I1 also controls a P-channel MOSFET M10 connected between VDD and the drain electrode 19 of M8.

Figure 5:
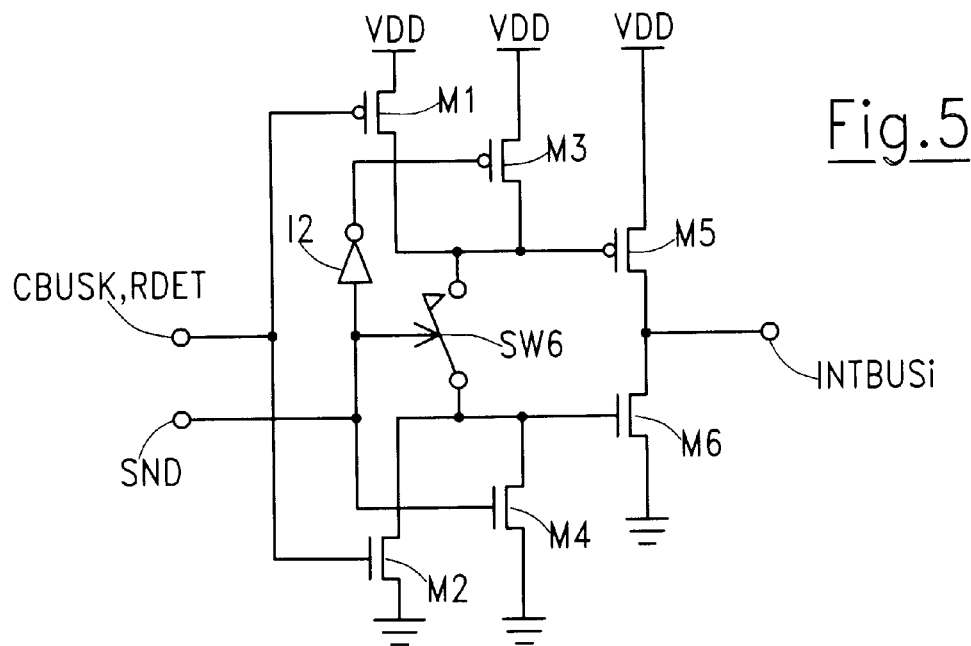
FIGS. 5 and 6 are circuit diagrams showing two types of tri-state interface circuits of the redundancy circuit of FIG. 1.

FIG. 5 is a circuit diagram of one of the tri-state interface circuits 3. One of the four signal lines CBUSk of bus CBUS, or the signal line RDET, supplies the gates of a P-channel MOSFET M1 and an N-channel MOSFET M2; M1 has a source connected to a voltage supply VDD, M2 has a source connected to ground; a drain of M1 can be coupled to a drain of M2 by means of a switch SW6 controlled by the internal timing signal SND. Signal SND also controls a gate of an N-channel MOSFET M4 with source connected to ground and drain connected to the drain of M1; signal SND also controls, through an inverter I2, a gate of a P-channel MOSFET M3 with source connected to VDD and drain connected to the drain of M2. The drains of MOSFETs M1 and M2 respectively control a gate of a P-channel MOSFET M5 and of an N-channel MOSFET M6 connected in series between VDD and ground; a common node of M5 and M6 is connected to a respective signal line INTBUSi of bus INTBUS. When signal SND is activated (at the low logic level), switch SW6 is closed, M4 and M3 are turned off, and the circuit behaves as a cascade of two inverters. When differently signal SND is deactivated (high logic level), switch SW6 is open, M3 and M4 are turned on, M5 and M6 are turned off, and the signal line INTBUSi is decoupled from the input of the interface circuit (i.e., the output of the interface circuit is in a high-impedance condition).

Figure 6:
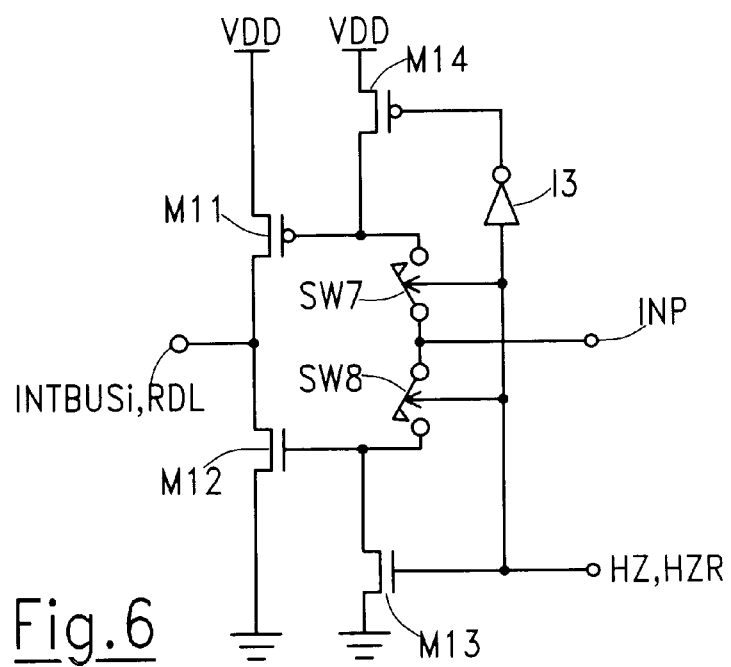

FIG. 6 is a circuit diagram of one of the tri-state interface circuits 8 or 12 of FIG. 1. The circuit has an input line INP, either one of the output signals of the sensing circuits 5 or the output signal of the redundancy sensing circuit 11, which controls, through two switches SW7 and SW8, the gates of a P-channel MOSFET M11 and an N-channel MOSFET M12 connected in series between VDD and ground and having a common node connected to a respective signal line INTBUSi of bus INTBUS or, in the case of circuit 12, to the redundancy data signal line RDL. Switches SW7 and SW8 are controlled by the control signals HZ or HZR (in the case of circuit 12), the generation thereof will be explained in the following. Signal HZ (or HZR) also controls an N-channel MOSFET M13 having a drain connected to the gate of M12 and a source connected to ground and, through an inverter I3, a gate of a P-channel MOSFET M14 having a source connected to VDD and a drain connected to the gate of M11. When signal HZ (or HZR) is deactivated (high logic level), switches SW7 and SW8 are open, M13 and M14 are turned on and M11 and M12 are turned off, so that the interface circuit is put in a high-impedance condition; when signal HZ (or HZR) is activated (low logic level), switches SW7 and SW8 are closed, M13 and M14 are turned off, and the interface circuit behaves as a common CMOS inverter. The interface circuit of FIG. 6 differs from that of FIG. 5 because the former is inverting, while the latter is non-inverting.

Figure 7:
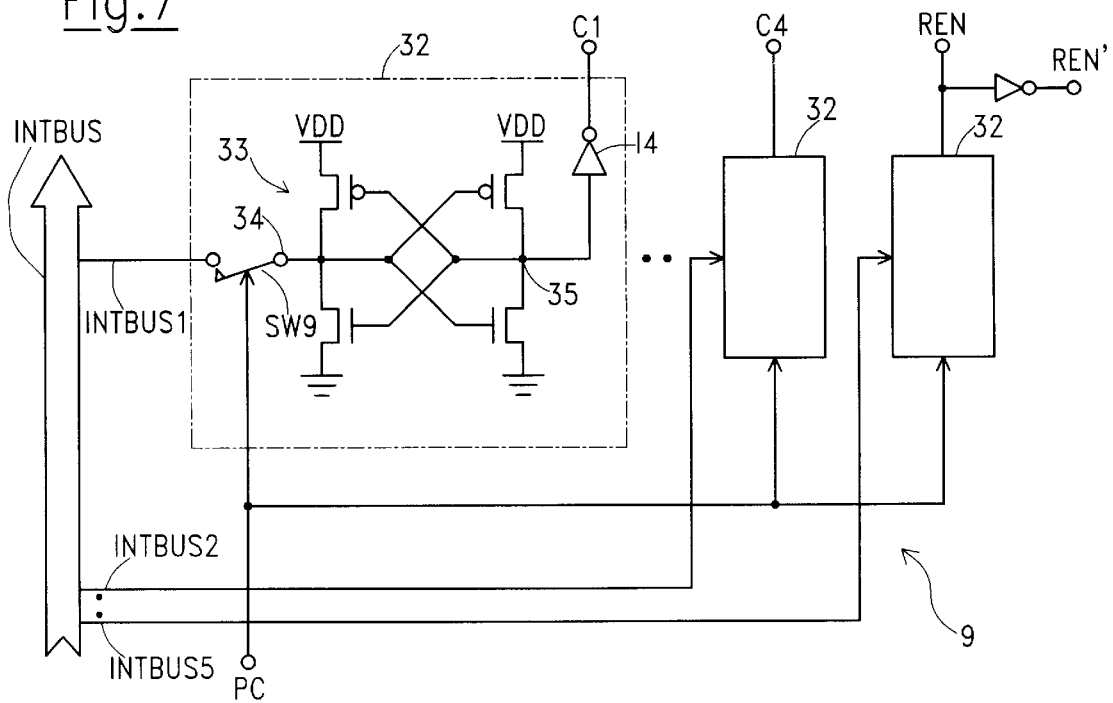
FIG. 7 is a schematic diagram of a dynamic memory register of the redundancy circuit of FIG. 1 for temporarily storing the informations suitable for locating an addressed defective bit line inside the memory matrix.

FIG. 7 shows the structure of the dynamic memory register 9 of FIG. 1. The circuit comprises a plurality (five in the shown example) memory units 32 each one supplied by a respective signal line INTBUS1–INTBUS5 of bus INTBUS (in the present example, it has been assumed that the signal lines of bus INTBUS which can be coupled to the signal lines of bus CBUS and RDET are the subset INTBUS1–INTBUS5). Each memory unit 32 comprises a bistable latch 33 having a set input 34 which can be selectively coupled, by means of a switch SW9 controlled by the internal timing signal PC, to a respective signal line of the subset INTBUS1–INTBUS5. The bistable latch 33 has an output line 35 which is supplied, through an inverter I4, to an output line C1–C4 and REN of the dynamic memory register 9. Signal REN' shown in FIG. 1 is the logic complement of signal REN, i.e. of signal RDET.

Figure 8:
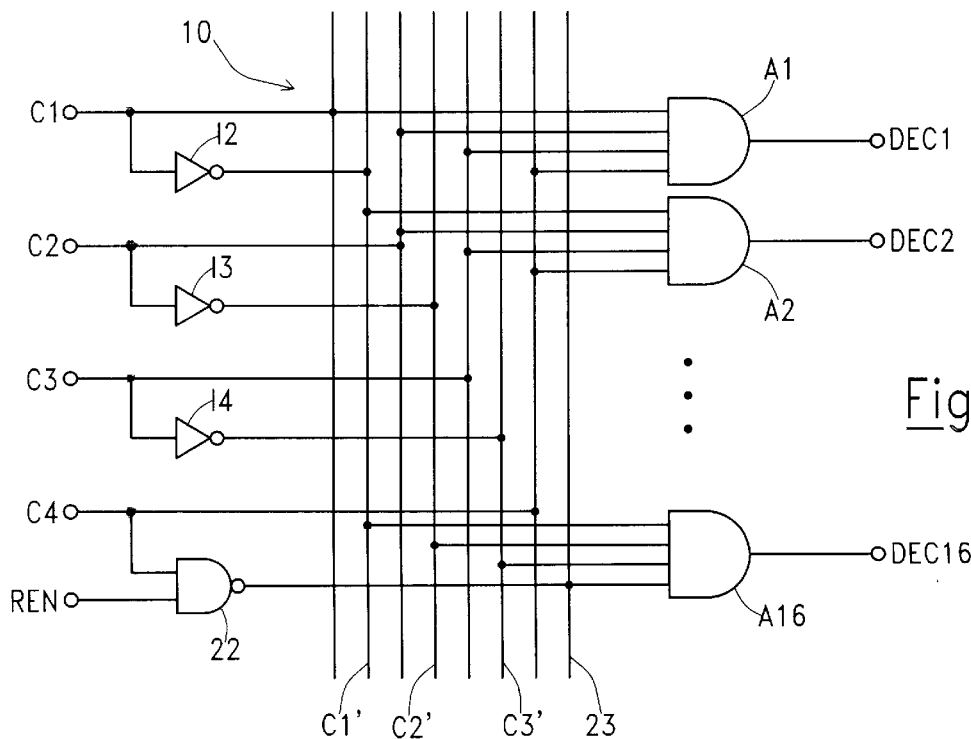
FIG. 8 is a circuit diagram of a decoder circuit for decoding said informations suitable for locating the addressed defective bit line inside the memory matrix.

FIG. 8 shows the structure of the decoder circuit 10. The circuit is supplied by the five output lines C1–C4 and REN of the dynamic memory register 10. The circuit comprises three inverters I2–I4 and a NAND gate 22: inverters I2–I4 are respectively supplied by signals C1–C3 and generate complemented signals C1'–C3' thereof; NAND gate 22 is supplied by signals C4 and REN and generates a signal 23 which when signal REN (i.e., signal RDET) is activated (high logic level) is equal to the logic complement of signal C4; when differently signal REN (=RDET) is deactivated, signal 23 is kept at the low logic level independently of the logic value of signal C4. The circuit also comprises sixteen AND gates A1–A16, each one supplied by a respective unique combination of four of the eight signals C1–C4, C1'–C3' and 23. Each AND gate A1–A16 generates an output signal forming one of the sixteen decoded signals DEC1–DEC16.

Figure 9:
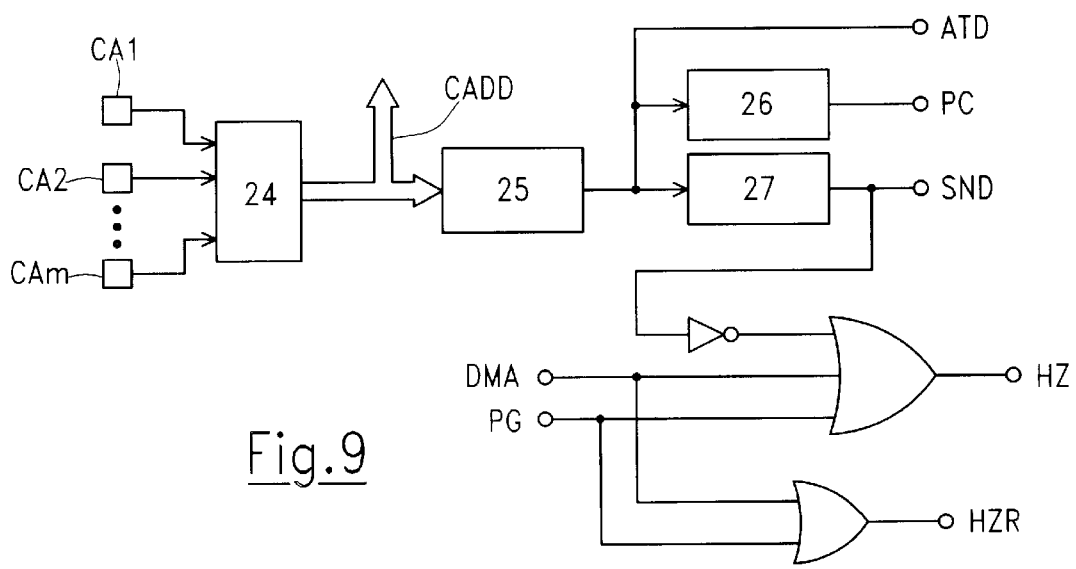
FIG. 9 schematically shows a circuit arrangement provided in the memory device for generating internal timing signals for the operation of the memory device and of the redundancy circuit of FIG. 1.

FIG. 9 is a schematic diagram showing the circuits for the generation of the first, second and third timing signals ATD, SND and PC. Signals supplied to address input terminals CA1, CA2 . . . CAm of the memory device supply a per-se known address buffer circuit 24 which generates the address signals of the bus CABUS. The address signals CABUS are conventionally supplied to an address transition detector circuit 25 which, upon transition of at least one of the address signals CABUS, activates the first timing signal ATD; signal ATD switches to the low logic level and remains at the low logic level for a prescribed time, then it returns to the high logic level. Signal ATD supplies a circuit 27 which generates the second timing signal SND; signal SND is normally at the high logic level, and goes to the low logic level when the ATD signal goes low; signal SND remains at the low logic level for a prescribed time longer than that of signal ATD. Signal ATD also supplies another circuit 26 which generates the third timing signal PC; signal PC is normally at the high logic level, and goes to the low logic level when the ATD signal goes low; signal PC remains at the low logic level for a prescribed time which is longer than that of the signal ATD, but is a little shorter than that of signal SND. Signal PC is conventionally used for example to precharge the bit lines of the memory matrix at the beginning of a read operation, and for setting the sensing circuits of the memory device in a prescribed initial state. Circuits 25, 26 and 27 can be for example monostable circuits.

Also, in FIG. 9 the circuits for the generation of signals HZ and HZR are shown. Normally, signals DMA and PG are deactivated (low logic level); in this condition, signal HZ is the logic complement of the internal timing signal SND, so that when signal SND is activated (low logic level), signal HZ is deactivated (high logic level) and the interface circuits 8 are in a high-impedance condition, while when signal SND is deactivated (high logic level) signal HZ is activated (low logic level) and the interface circuits 8 drives the respective signal lines of bus INTBUS. When differently one or the other of signals DMA and PG is activated (high logic level), signal HZ is deactivated (high logic level) and the interface circuits 8 are in the high-impedance condition. Signal HZR is instead simply the logic OR of signals DMA and PG, so that HZR is normally activated (low logic level) and the interface circuit 12 couple the output of the redundancy sensing circuit 11 to the redundancy data signal line RDL, while when one or the other of signals DMA and PG is activated, signal HZR is deactivated (high logic level) and the interface circuit 12 is in the high impedance condition.

Figure 10:
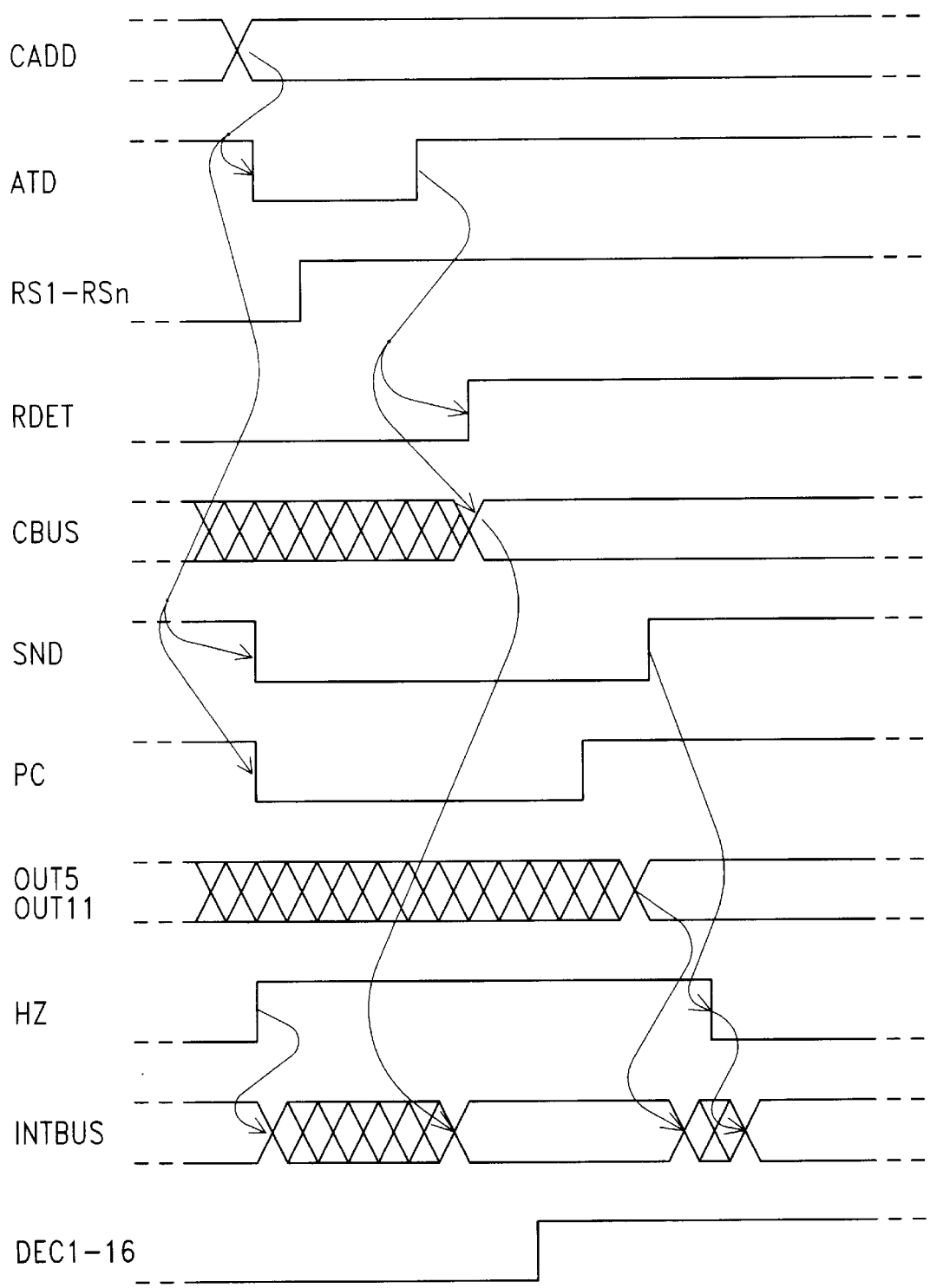
FIG. 10 is a timing diagram showing the time evolution of some signals of the column redundancy circuit of the present invention during a read cycle of the memory device.

The operation of the column redundancy circuit previously described will be now explained making reference to the timing diagram of FIG. 10.

A read cycle of the memory device starts when one or more of the address input signals CA1–CAn changes. The corresponding signals of the CABUS bus change logic level. This causes the activation of signal ATD, which goes to the low logic level and remains low for a prescribed time. The high-to-low transition of the ATD signal also causes the activation of signals SND and PC, which go to the low logic level.

As long as the ATD signal is at the low logic level, MOSFETs M8 and M9 in the redundancy detector 2 are kept on and off, respectively. Signal RDET is thus kept at the low logic level. Signals CKR in the redundancy registers RR1–RRn are also kept at the low logic level, and the switches of the arrays SW in FIG. 3 are open. The identifying-code output signals OC0–OC3 of all the redundancy registers RR1–RRn are decoupled from the signals of the local code bus CBUS.

As soon as signal SND goes low, signal HZ is deactivated switching the interface circuits 8 into a high-impedance condition: bus INTBUS is thus made available to other resources of the memory device. Also, as soon as signal SND switches low the interface circuits 3 exit the high-impedance mode, and the signal lines of bus CBUS and signal line RDET are connected to the respective signal lines INTBUS1–INTBUS5 of bus INTBUS.

If the current address supplied to the memory device is not a defective address, no one of signals RS1–RSn will be activated and, consequently, no one of MOSFETs M71–M7n in the redundancy detector circuit 4 will be turned on.

When the ATD signal returns to the high logic level, MOSFETs M8 and M9 in the redundancy detector 4 are turned off and on, respectively, but signal RDET remains at the low logic level because no one of MOSFETs M71–M7n is in the on state.

Signal PC is deactivated before the deactivation of signal SND, so that the dynamic memory register 9 can store the logic state existent on the signal lines INTBUS1–INTBUS5 when the latter are assigned to the signal lines of bus CBUS and RDET. The logic value of signal RDET can thus be provided to the decoder circuit 10 which, since RDET="0", does not activate any signal DEC1–DEC16. In the input/output data buffers I/OB1–I/OB16, switch SW1 connects therefore the data input of output buffer 28 to the respective signal line INTBUSi of bus INTBUS.

When signal SND returns to the high logic level, the interface circuits 3 are put in a high-impedance condition, signal HZ is activated and the interface circuits 8 are activated to connect the output signals of the sensing circuits 5 to the respective signal lines of bus INTBUS. The read data provided at the output of the sensing circuits 5 can thus be supplied to the input/output data terminals I/O1–I/O16 of the memory device.

If differently the current address supplied to the memory device is a defective address, the redundancy memory register wherein said defective address is stored activates the respective signal RS1–RSn. The activated redundancy selection signal allows selection of one of the redundancy bit lines in packet 50. Also, one of the MOSFETs M71–M7n will be turned on, but as long as the ATD signal is at the low logic level signal RDET remains at the low logic level. When the ATD signal returns to the high logic level, switches SW in the redundancy memory register wherein the defective address is stored close, connecting the output signals OC0–OC3 of the second part of the redundancy register to the respective signal lines of bus CBUS. In addition, when the ATD signal returns to the high logic level, node 19 in the redundancy detector 2 will be pulled to ground by the MOSFET M71–M7n which is associated to the redundancy memory register wherein the defective address is stored. Signal RDET switches therefore to the high logic level, to indicate that the currently addressed bit line is a defective bit line.

As long as signal SND remains at the low logic level, the identifying code present on signal lines of bus CBUS and signal RDET are transferred to the respective signal lines INTBUS1–INTBUS5 of bus INTBUS, and are thus transferred from the region of the chip wherein the redundancy memory registers are integrated to the region of the chip in proximity of the input/output data terminals I/O1–I/O16. The identifying code and the signal RDET are stored in the dynamic memory register 9. These data are provided to the decoder circuit 10 which, according to the specific value of the identifying code, activates one of the sixteen decoded signals DEC1–DEC16, corresponding to the input/output data terminal I/O1–I/O16 associated to the packet P of bit lines wherein the addressed defective bit line is located.

Before signal SND returns to the high logic level, signal PC returns to the high logic level, isolating the dynamic memory register 9 from the signal lines INTBUS1–INTBUS5 of bus INTBUS.

When also signal SND returns to the high logic level, the interface circuits 3 are switched in a high-impedance condition, so that signal lines of bus CBUS and RDET are isolated from signal lines INTBUS1–INTBUS5 of bus INTBUS. At this time, signal HZ is activated to activate the interface circuits 8, so that the read data at the output of the sensing circuits 5 can be transferred onto respective signal lines INTBUS1–INTUS16 of bus INTBUS. Also, being signal HZR activated (neither signal DMA nor PG are activated), the redundancy read data present at the output of the redundancy sensing circuit 11 is put on the redundancy data signal line RDL and transferred to the region of the chip wherein the input/output data buffers are integrated.

In all the input/output data buffers I/OB1–I/OB16 for which the associated decoded signal DEC1–DEC16 is not activated, the data input of the output buffer 28 is coupled to a respective signal line INTBUSi of bus INTBUS. In the input/output data buffer for which the corresponding decoded signal DECi is activated (i.e., the input/output data buffer which is associated to the packet P of bit lines BL wherein the defective bit line is located), the data input of the output buffer 28 is instead coupled (by switch SW1) to the redundancy data signal line RDL carrying the output signal of the redundancy sensing circuit 11. At the input/output data terminal I/Oi associated to such packet P of bit lines the datum read from the redundancy bit line will be provided instead of the datum read from the defective bit line.

In program mode, signal LD is deactivated to put the output data buffers 28 inside all the input/output data buffers I/OB1–I/OB16 in a high impedance condition. Signal DID is instead activated to enable all the input data buffers 29. Also signal PG is activated to close switch SW2 so that the output signal of the input data buffer 29 can be supplied either to a respective signal line of bus INTBUS or, if the memory cell to be programmed belongs to a defective bit line, to the redundancy data signal line RDL, by means of switch SW1. The activation of signal PG deactivates signals HZ and HZR, so that the interface circuits 8 and 12 are put in a high-impedance condition; activation of signal PG further activates the programming circuits 6, 7 and the redundancy programming circuit 13, 14. If the memory cell to be programmed belongs to a defective bit line, signal REN'="0", MOSFET M20 is open and the datum to be programmed is put on line RDL. If differently the memory cell to be programmed belongs to a non-defective bit line, signal REN'="1", MOSFET M20 and switch SW20 are closed and line RDL is kept grounded.

Signal DMA is activated by the control logic 15 in a particular test mode conventionally known as "Direct Memory Access", allowing a direct access to the matrix memory cells (or to the redundancy memory cells) which can be directly driven from the input/output data terminals I/O1–I/O16 of the memory device. With reference to FIG. 2, when the signal DMA is activated signals LD and DID are both deactivated to put the output buffer 28 and the input buffer 29 in a high-impedance condition. Also, the activation of signal DMA causes switch SW4 to close; switch SW5 couples the input/output data terminal I/Oi to the respective signal line INTBUSi if the respective decoded signal DECi is deactivated, or to the redundancy data signal line RDL if the decoded signal DECi is activated. Since, as visible from FIG. 9, the activation of signal DMA causes both signals HZ and HZR to be deactivated (high logic level), the interface circuits 8 and 12 are in the high-impedance condition; since moreover during DMA test signal PG is deactivated, the programming circuits 6, 7 and 13, 14 are deactivated.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Semiconductor memory device comprising:
   a plurality of output data terminals;
   a matrix of memory cells comprising a plurality of groups of columns of memory cells, each group of columns being associated with a respective output data terminal;
   column selection means associated with said matrix of memory cells for selectively coupling one column for each of said groups of columns to a respective sensing means driving said output data terminal;
   redundancy columns of redundancy memory cells for functionally replacing defective columns in said matrix;
   redundancy column selection means associated with said redundancy columns for selectively coupling one redundancy column to a redundancy sensing means;
   defective address storage means for storing defective addresses of said defective columns and identifying codes suitable for identifying the groups of columns wherein the defective columns are located, for comparing said defective addresses with a current address supplied to the memory device and for driving said redundancy column selection means for selecting a redundancy column when a current address supplied to the memory device coincides with one of said defective addresses;
   a shared bus including a plurality of signal lines provided in the memory device for interconnecting a plurality of circuit blocks of the memory device and for transferring signals between said circuit blocks, the shared bus being selectively assignable to said circuit blocks in prescribed respective time intervals;
   first bus assignment means associated with the defective address storage means;
   second bus assignment means associated with said sensing means;
   the first bus assignment means assigning the shared bus, during a first prescribed time interval of a read cycle of the memory device, to said defective address storage means for transferring the identifying code of an addressed defective column to the output data terminals;
   the second bus assignment means assigning the shared bus, during a second prescribed time interval of the read cycle, to said sensing means for transferring output signals of said sensing means to said output data terminals;
   the transferred identifying code determining an output data terminal associated with the group of columns to which the addressed defective column belongs to be supplied by an output signal of said redundancy sensing means in alternative to an output of the sensing means associated with said group of columns.

2. Semiconductor memory device according to claim 1, further comprising a redundancy data signal line for transferring the output signal of the redundancy sensing means to said plurality of output data terminals.

3. Semiconductor memory device according to claim 2, wherein said first bus assignment means comprises first interface means for coupling local signal lines of said defective address storage means carrying the identifying code of the addressed defective column to respective signal lines of the shared bus, said first interface means being activated during said first prescribed time interval and being deactivated during said second prescribed time interval for isolating said local signal lines from the respective signal lines of the shared bus.

4. Semiconductor memory device according to claim 3, wherein said second bus assignment means comprises second interface means for coupling the output signals of said sensing means to respective signal lines of the shared bus, said second interface means being activated during said second prescribed time interval and being deactivated during said first prescribed time interval for isolating said output signals of the sensing means from the respective signal lines of the shared bus.

5. Semiconductor memory device according to claim 4, wherein said first and second interface means comprises tri-state buffer circuits.

6. Semiconductor memory device according to claim 5, wherein said first interface means comprises a first plurality of tri-state non-inverting buffer circuits, each tri-state buffer circuit of said first plurality comprising a first inverter stage having a pull-up transistor and a pull-down transistor driven by a respective input signal, the first inverter stage driving a second inverter stage having a pull-up transistor and a pull-down transistor, and transistor means controlled by a control signal which is activated during said first prescribed time interval, said transistor means being activated when the control signal is disactivated to simultaneously turn the pull-up and pull-down transistor of the second inverter stage off.

7. Semiconductor memory device according to claim 5, wherein said second interface means comprise a plurality of inverting tri-state buffer circuits, each tri-state buffer circuit comprising an inverter stage having a pull-up transistor and a pull-down transistor driven by a respective input signal, switching means controlled by a control signal for decoupling the respective input signal from the inverter stage, and transistor means controlled by said control signal for simultaneously turning the pull-up and pull-down transistors of the inverter stage off.

8. Semiconductor memory device according to claim 5, further comprising identifying code decoder means for decoding the transferred identifying code and for generating decoded signals for controlling a data input of the output data terminals to switch between a respective signal line of the shared bus and the redundancy data signal line.

9. Semiconductor memory device according to claim 8, wherein each of said output data terminals comprises first switching means controlled by a respective decoded signal for selectively coupling, locally to the output data terminal, the data input of the output data terminal to a respective signal line of the shared bus or the redundancy data signal line.

10. Semiconductor memory device according to claim 9, further comprising dynamic storage means supplied by the shared bus for storing, during said first prescribed time interval, the transferred identifying code and for supplying the transferred identifying code stored therein to the identifying code decoder means during said second prescribed time interval.

11. Semiconductor memory device according to claim 10, wherein said defective address storage means comprises a redundancy detector generating a redundancy detection signal when a defective column is addressed, said first bus assignment means allowing to transfer of the redundancy detection signal, during the first prescribed time interval, to a respective signal line of the shared bus which also supplies the dynamic storage means, the redundancy detection signal preventing, when deactivated, the identifying code decoder means from generating said decoded signals for controlling the output data terminals.

12. Semiconductor memory device according to claim 11, wherein said output data terminals comprise data output buffer means supplied by said first switching means.

13. Semiconductor memory device according to claim 12, wherein said output data terminals comprise data input buffer means which drives respective signal lines of the shared bus for transferring a data word to be programmed to programming circuits associated with said groups of bit lines.

14. Semiconductor memory device according to claim 13, wherein said redundancy data signal line also supplies a redundancy programming circuit associated with said redundancy columns.

15. Semiconductor memory device according to claim 14, wherein an output of said data input buffer means can be switched from the respective signal line of the shared bus to said redundancy data signal line if the column to be programmed is a defective column.

16. Semiconductor memory device according to claim 15, wherein each of said output data terminals comprises second switching means controlled by a respective one of said decoded signals for selectively coupling, locally to the output data terminal, an output of the input buffer means to the respective signal line of the shared bus or to the redundancy data signal line.

17. Semiconductor memory device according to claim 16, further comprising third interface means associated with the redundancy sensing means for selectively coupling the output of the redundancy sensing means to the redundancy data signal line when the memory device is not to be programmed.

18. Semiconductor memory device according to claim 17, wherein each output data terminal comprises third switching means controlled by the respective decoded signal and activatable in a test mode of the memory device for selectively coupling, locally to the output data terminal, the data input of the input data buffer means directly to the respective signal line of the shared bus or to the redundancy data signal line.

19. A memory device comprising: a plurality of output data terminals; a matrix of memory cells comprising a plurality of groups of columns of memory cells, each group of columns being associated with a respective output data terminal; a sensing circuit; a column selection circuit associated with said matrix of memory cells for selectively coupling one column for each of said groups of columns to a respective sensing circuit driving said output data terminal; redundancy columns of redundancy memory cells for functionally replacing defective columns in said matrix; a redundancy sensing circuit; a redundancy column selection circuit associated with said redundancy columns for selectively coupling one redundancy column to a redundancy sensing circuit; a defective address storage circuit for storing defective addresses of said defective columns and identifying codes suitable for identifying the groups of columns wherein the defective columns are located, for comparing said defective addresses with a current address and for driving said redundancy column selection circuit for selecting a redundancy column when a current address coincides with one of said defective addresses; a plurality of circuit blocks; a shared bus including a plurality of signal lines for interconnecting said plurality of circuit blocks and for transferring signals between said circuit blocks, the shared bus being selectively assignable to said circuit blocks in prescribed respective time intervals; a first bus assignment circuit associated with the defective address storage circuit; a second bus assignment circuit associated with said sensing circuit; said first bus assignment circuit assigning the shared bus, during a first prescribed time interval of a read cycle, to said defective address storage circuit for transferring the identifying code of an addressed defective column to the output data terminals; said second bus assignment circuit assigning the shared bus, during a second prescribed time interval of the read cycle, to said sensing circuit for transferring output signals of said sensing circuit to said output data terminals; said transferred identifying code determining an output data terminal associated with the group of columns to which the addressed defective column belongs to be supplied by an output signal of said redundancy sensing circuit in alternative to an output of the sensing circuit associated with said group of columns.

20. A memory device according to claim 19, further comprising a redundancy data signal line for transferring the output signal of the redundancy sensing circuit to said plurality of output data terminals.

21. A memory device according to claim 20, wherein said first bus assignment circuit comprises a first interface circuit for coupling local signal lines of said defective address storage circuit carrying the identifying code of the addressed defective column to respective signal lines of the shared bus, said first interface circuit being activated during said first prescribed time interval and being deactivated during said second prescribed time interval for isolating said local signal lines from the respective signal lines of the shared bus.

22. A memory device according to claim 21, wherein said second bus assignment circuit comprises a second interface circuit for coupling the output signals of said sensing circuit to respective signal lines of the shared bus, said second interface circuit being activated during said second prescribed time interval and being deactivated during said first prescribed time interval for isolating said output signals of the sensing circuit from the respective signal lines of the shared bus.

23. Semiconductor memory device according to claim 22, wherein said first and second interface circuits each comprise a tri-state buffer circuit.

24. A memory device according to claim 23, wherein said first interface circuit comprises a first plurality of tri-state non-inverting buffer circuits, each tri-state buffer circuit of said first plurality including a first inverter stage having a pull-up transistor and a pull-down transistor driven by a respective input signal, the first inverter stage driving a second inverter stage having a pull-up transistor and a pull-down transistor, and a further transistor controlled by a control signal which is activated during said first prescribed time interval, said further transistor being activated when the control signal is deactivated to simultaneously turn the pull-up and pull-down transistor of the second inverter stage off.

25. A memory device according to claim 23, wherein said second interface circuit comprise a plurality of inverting tri-state buffer circuits, each tri-state buffer circuit including an inverter stage having a pull-up transistor and a pull-down transistor driven by a respective input signal, a switching circuit controlled by a control signal for decoupling the respective input signal from the inverter stage, and a further transistor controlled by said control signal for simultaneously turning the pull-up and pull-down transistors of the inverter stage off.

26. A memory device according to claim 23, further comprising an identifying code decoder for decoding the transferred identifying code and for generating decoded signals for controlling a data input of the output data terminals to switch between a respective signal line of the shared bus and the redundancy data signal line.

27. A memory device according to claim 26, wherein each of said output data terminals comprises a first switching circuit controlled by a respective decoded signal for selectively coupling, locally to the output data terminal, the data input of the output data terminal to a respective signal line of the shared bus or the redundancy data signal line.

28. A memory device according to claim 27, further comprising a dynamic storage circuit supplied by the shared bus for storing, during said first prescribed time interval, the transferred identifying code and for supplying the transferred identifying code stored therein to the identifying code decoder during said second prescribed time interval.

29. A memory device according to claim 28, wherein said defective address storage circuit includes a redundancy detector generating a redundancy detection signal when a defective column is addressed, said first bus assignment circuit allowing the transfer of the redundancy detection signal, during the first prescribed time interval, to a respective signal line of the shared bus which also supplies the dynamic storage circuit, the redundancy detection signal preventing, when deactivated, the identifying code decoder circuit from generating said decoded signals for controlling the output data terminals.

30. A memory device according to claim 29, wherein said output data terminals comprise data output buffers supplied by said first switching circuit.

31. Semiconductor memory device according to claim 30, wherein said output data terminals comprise data input buffers which drives respective signal lines of the shared bus for transferring a data word to be programmed to programming circuits associated with said groups of bit lines.

32. A memory device according to claim 31, wherein said redundancy data signal line also supplies a redundancy programming circuit associated with said redundancy columns.

33. A memory device according to claim 32, wherein an output of said data input buffer circuit can be switched from the respective signal line of the shared bus to said redundancy data signal line if the column to be programmed is a defective column.

34. A memory device according to claim 33, wherein each of said output data terminals comprise a second switching circuit controlled by a respective one of said decoded signals for selectively coupling, locally to the output data terminal, an output of the input buffer to the respective signal line of the shared bus or to the redundancy data signal line.

35. A memory device according to claim 34, further comprising third interface circuit associated with the redundancy sensing circuit for selectively coupling the output of the redundancy sensing circuit to the redundancy data signal line when the memory device is not to be programmed.

36. A memory device according to claim 35, wherein each output data terminal comprises a third switching circuit controlled by the respective decoded signal and activatable in a test mode of the memory device for selectively coupling, locally to the output data terminal, the data input of the input data buffer directly to the respective signal line of the shared bus or to the redundancy data signal line.

37. In a memory device having plurality of output data terminals; a matrix of memory cells comprising a plurality of groups of columns of memory cells, each group of columns being associated with their respective output data terminal; a sensing circuit; a column selection circuit associated with said matrix of memory cells for selectively coupling one column for each of said groups of columns to a respective sensing circuit; a redundancy sensing circuit; a redundancy column selection circuit associated with said redundancy columns plus selectively coupling one redundancy column to a redundancy sensing circuit; a defective address storage circuit; a shared bus; a first bus assignment circuit associated with the defective address storage circuit; and a second bus assignment circuit associated with said sensing circuit; a method of providing column redundancy comprising; storing defective addresses of said defective columns and identifying codes suitable for identifying the groups of columns wherein the defective columns are located; comparing said defective addresses with a current address for driving said redundancy column selection circuit for selecting a redundancy column when a current address coincides with one of said defective addresses; assigning the shared bus, during a first prescribed time interval of a read cycle to said defective address storage circuit for transferring the identifying code of an addressed defective column to the output data terminals; assigning the shared bus, during a second prescribed time interval of the read cycle to said sensing circuit transferring output signals of said sensing circuit to said output data terminals; said transferred identifying code determining an output data terminal associated with the group of columns to which the addressed defective column belongs to be supplied by an output signal of said redundancy sensing circuit an alternative to output of the sensing circuit associated with said group of columns.

38. A method in accordance with claim 37 including providing a redundancy data signal line for transferring the output signal of the redundancy sensing circuit to said plurality of output data terminals.

39. A method in accordance with claim 38 including coupling local signal lines of said defective address storage circuit carrying the identifying code of the addressed defective column to respective signal lines of the shared bus, said first interface circuit being activated during said first prescribed time interval and being deactivated during said second prescribed time interval for isolating said local signal lines from the respective signal lines of the shared bus.

40. A method in accordance with claim 39 including coupling the output signals of said sensing circuit to respective signal lines of the shared bus, said second interface circuit being activated during said second prescribed time interval and being deactivated during said first prescribed time interval for isolating said output signals of the sensing circuit from the respective signal lines of the shared bus.

41. A method in accordance with claim 37 including decoding the transferred identifying code and generating decoding signals for controlling a data input of the output data terminals to switch between a respective signal line of the shared bus and redundancy data signal line.

* * * * *